United States Patent [19]
Buck

[11] 3,747,012
[45] July 17, 1973

[54] CONTACTLESS OSCILLATOR-TYPE PROXIMITY SENSOR WITH ADJUSTABLE HYSTERESIS

[76] Inventor: Robert Buck, Torkelweg 47, Lindau-Enzisweiler, Germany

[22] Filed: Sept. 21, 1972

[21] Appl. No.: 290,868

Related U.S. Application Data

[63] Continuation-in-part of Ser. No. 79,741, Oct. 12, 1970, abandoned.

[52] U.S. Cl. ............ 331/65, 317/146, 317/148.5 R, 324/3, 324/40, 328/5, 331/109, 331/117 R, 331/183, 331/186, 340/258 C

[51] Int. Cl. ...... H01h 36/00, H03b 3/02, H03b 5/12

[58] Field of Search .................. 331/65, 109, 117 R, 331/183, 185, 186; 324/40, 41, 71 R, 71 SN, 3; 340/258 C, 266, 282; 328/5; 307/116; 317/146, 148.5 R, 148.5 B

[56] References Cited

UNITED STATES PATENTS 3,312,935 4/1967 Brothman et al. .............. 331/109 X
3,350,660 10/1967 Engdahl et al. ........................ 331/65
3,555,448 1/1971 Clarke, Jr. et al. .................... 331/65
3,549,905 12/1970 Johnson ............................ 331/65 X

*Primary Examiner*—Roy Lake
*Assistant Examiner*—Siegfried H. Grimm
*Attorney*—Karl F. Ross

[57] ABSTRACT

A proximity sensor including an oscillator, whose output amplitude varies with the approach of an extraneous metallic element, comprises a main transistor whose emitter resistance is constituted in part by an ancillary transistor controlled by the rectified oscillator output to trigger a thyristor for changing the current flow through a load whenever the amplitude of the oscillations decreases to a critical level. Upon the firing of the thyristor, the ancillary transistor opens a resistive shunt path in the emitter circuit of the main transistor where negative feedback is intensified; this reduces the loop gain of the oscillator whose response threshold is thus raised to provide a hysteresis or toggle effect which can be adjusted by means of a variable resistor also forming part of the emitter resistance of the main transistor.

9 Claims, 1 Drawing Figure

PATENTED JUL 17 1973 3,747,012
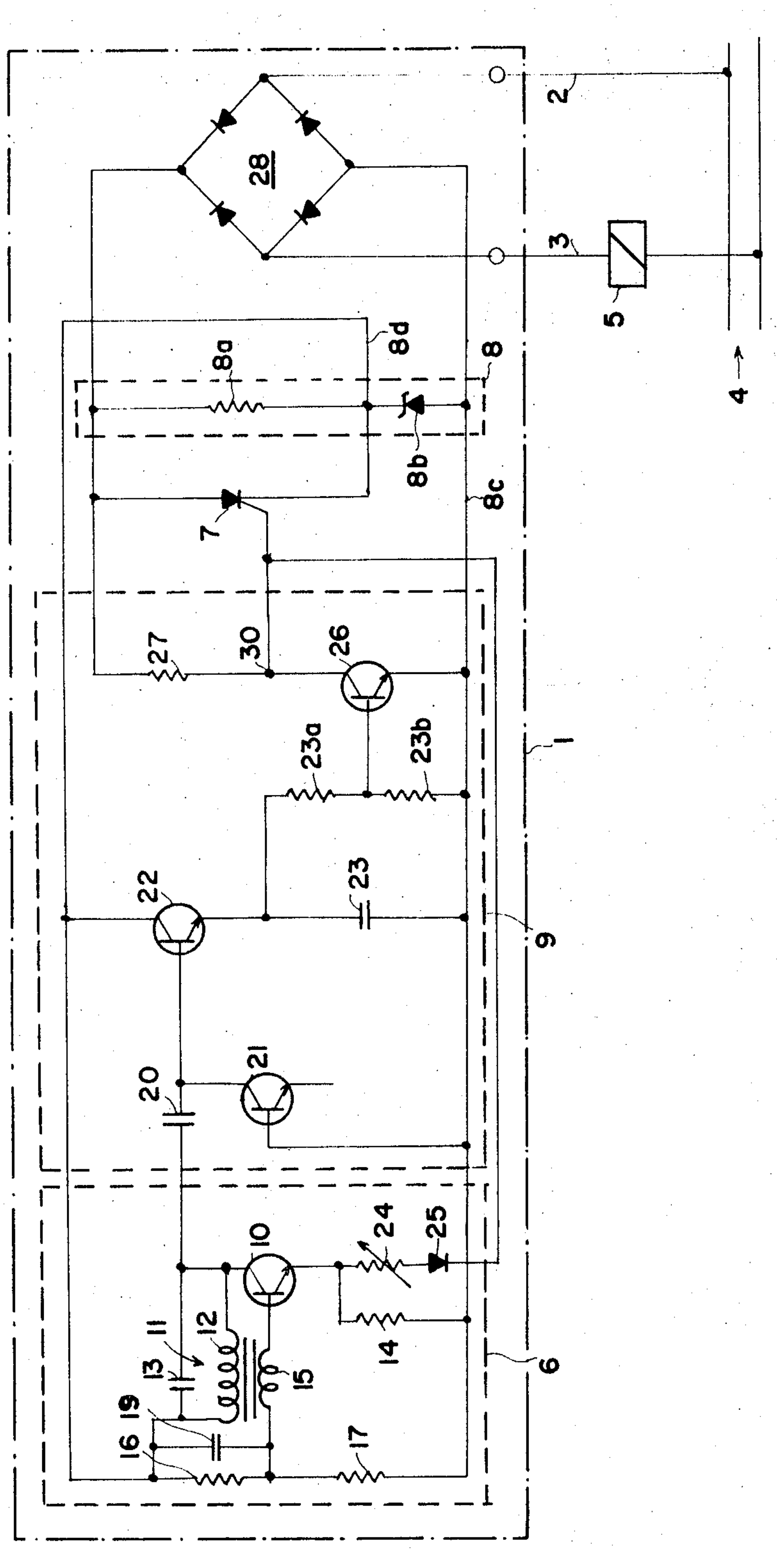

CONTACTLESS OSCILLATOR-TYPE PROXIMITY SENSOR WITH ADJUSTABLE HYSTERESIS

This application is a continuation-in-part of my copending application Ser. No. 79,741, filed Oct. 12, 1970 and now abandoned.

FIELD OF THE INVENTION

My present invention relates to contactless switching systems which are proximity-responsive, i.e., which do not require direct contact between the activating element and the activated circuit.

BACKGROUND OF THE INVENTION

Conventional distance or proximity indicators, designed to respond to the relative movement of a part carrying the indicator and an element whose approach is to be detected, generally make use of switching devices having two operating conditions (e.g., open and closed) respectively signaling the fact that said element is or is not within a predetermined range. Systems relying on physical contact with the approaching element are, of course, prone to wear, are sensitive to mechanical fatigue, are disrupted by environmental contamination and often are triggered erroneously.

There have been proposed arrangements of the digital type which sense in a contactless manner the proximity of a metal part to the indicator, e.g., in a machine tool. Such systems may include an oscillator generating an output voltage which depends upon the proximity of the metal part whose spacing from the oscillator is to be gauged. As is well known, an amplifier with positive feedback having a regenerative coupling factor $K$ and an amplification factor $V$ will oscillate when $KV > 1$, the product $KV$ being known as the loop gain. When, however, the metal part approaches, the loop gain is decreased until, at a predetermined spacing, $KV < 1$, whereupon the circuit ceases to oscillate. The output of the oscillator, alternating between the oscillating and the nonoscillating condition, gives rise to a signal which may be applied through a snap-action amplifier to an electronic switch, e.g., a transistor or a thyristor, to operate a load in the form of a counter or signaling device.

As noted in my copending application Ser. No. 80,016 filed Oct. 12, 1970, and now abandoned, and its continuation-in-part, Ser. No. 290,866, filed concurrently with the present application, conventional systems of this type using a two-wire supply line have the disadvantage that they require complex energization circuits often necessitating the use of current converters, transformers or the like to maintain current flow to the oscillator circuit independently of the controlled switch.

Also, the switching hysteresis of the circuit, i.e., the relative offset between the switchover positions upon the aproach and the removal of the controlling (usually metallic) element, is not adjustable in conventional arrangements. As a consequence, the vibration of a metallic element may give rise to an erroneously increased count in a system designed to determine the number of such approaches.

OBJECTS OF THE INVENTION

It is, therefore, the principal object of the present invention to provide an improved contactless proximity sensor of reduced susceptibility to vibration.

It is another object of the invention to provide a sensor of the character described with adjustable hysteresis or toggle effect.

SUMMARY OF THE INVENTION

These objects and others which will become apparent hereinafter are attained, in accordance with the present invention, in a switching system in which an oscillator, whose damping or attenuation increases with increasing proximity of a metal part as is well known per se, is connected, preferably via a snap-action transistor circuit, to an electronic switch whose state (conductive or nonconductive) is reversed when the loop gain $KV$ passes from a value greater than unity to a value less than unity. According to the invention, the rectified output voltage of the oscillator is used to generate a feedback signal which precipitously raises the amplification factor $V$ of the oscillator when the oscillations increase in amplitude (i.e., when damping is reduced by the receding metal part) and conversely lowers this factor $V$ when the amplitude decreases upon an approach of the switchover point in the opposite sense. This switchover point is, of course, defined as the predetermined distance corresponding to $KV = 1$.

The resulting change in sensitivity raises the response threshold of the system so that a larger amplitude swing is now required to restore the previous switch position. Thus, the system is nonresponsive to reversals of movement within a certain distance range, or region of hysteresis, whose extent is advantageously adjustable by a variable resistor in the feedback path.

The system of the present invention makes use of an oscillatory main transistor having an emitter resistance which determines the amplification factor of this transistor and is controlled by a feedback circuit designed to vary the emitter resistance in response to changes in the rectified oscillator output voltage. A resistor in the emitter lead of the main transistor is bridged by the series combination of a diode and the collector-emitter path of an ancillary transistor, the base of the latter being energized by the rectified oscillator output voltage. The collector of this ancillary transistor may be connected via a biasing resistor to the power source, this resistor and the collector-emitter path of the ancillary transistor lying in parallel with a coupling network as described in my copending application Ser. No. 80,016 and its continuation-in-part of even date. An electronic switch such as a thyristor is connected across a high-ohmic resistor which forms part of the aforementioned coupling network and lies in series with a Zener diode across the output terminals of a rectifier bridge fed through a current-responsive relay or other load from an alternating-current source via two conductors of a supply line.

DESCRIPTION OF THE DRAWING

The above and other objects, features and advantages of the present invention will become more readily apparent from the following description, reference being made to the accompanying drawing in which the sole FIGURE is a circuit diagram of an electronic proximity sensor embodying the present invention.

SPECIFIC DESCRIPTION

The contactless metal detector or sensor 1 shown in the drawing comprises an oscillator 6 which feeds a snap-action transistor amplifier 9 to trip an electronic switch 7 and thereby operate a load 5. The circuit is energized by wires 2, 3 of a two-conductor line connected to an alternating-current supply source 4, in series with a current-responsive relay coil 5. The relay coil 5, of course, represents any load which it is desired to operate via the contactless sensor.

Conductors 2 and 3 are connected across the input terminals of a rectifier bridge 28 whose output terminals feed a coupling network 8 for energizing the oscillator 6. To this end, the network 8 comprises a high-ohmic resistor 8*a* in series with a Zener diode 8*b* and in parallel with the anode-cathode path of the electronic switch 7, here shown to be a thyristor. A constant supply voltage for the oscillator is developed across the Zener diode 8*b* and is taken off by bus bars 8*c* and 8*d*.

In the nonconductive state of the thyristor 7, a bleed current is drawn through the network 8 and consequently a small current flows through lines 2 and 3 so that the coil 5 is only slightly energized and the relay is not operated. When the thyristor 7 is triggered into its conductive state, however, resistor 8*a* is effectively short-circuited so that the resistance of network 8 is lowered whereby a larger current flows through the bridge 28 and hence through line 2, 3, thereby tripping the relay 5.

The oscillator 6 comprises a main transistor of NPN type 10 whose collector circuit includes a parallel-resonant tuned network 11 consisting of an inductor 12 and a capacitor 13. The base of transistor 10 is connected via a feedback inductor 15 to the junction of a voltage divider 18 whose resistances are represented at 16 and 17 and are connected, respectively, to the resonant network 11 and to a resistor 14 in the emitter lead of the transistor. A shunt capacitor 19 is connected across the resistance 16.

As noted in my copending application Ser. No. 80,017, filed Oct. 12, 1970 and now abandoned, and its continuation-in-part. Ser. No. 290,867, also filed concurrently with the present application, inductor 15 forms part of a regenerative-feedback path establishing the above-discussed coupling factor *K*. For this purpose, coils 12 and 15 are electromagnetically coupled as diagrammatically indicated in the drawing; a Hartley-type oscillator circuit could also be used. The proximity of a metallic element lowers the Q of tuned network 11, thereby reducing the effective collector resistance of transistor 10 along with the amplification factor *V* and attenuating the oscillator output.

The output of the oscillator is derived from the collector of transistor 10 and is applied via a d.c.-blocking coupling condenser 20 to the base of a second transistor 22 of the NPN type, the transistor 22 forming an input stage of a snap-action trigger circuit 9. A transistor 21, connected as a diode between bus bar 8*c* and the base lead of transistor 22, serves to apply a positive bias to the base of the latter transistor. The emitter circuit of the transistor 22 includes a storage capacitor 23 forming a time-constant network with a pair of resistors 23*a* and 23*b* of a voltage divider feeding the base of an ancillary NPN transistor which is the output stage of amplifier 9 and whose collector is connected to the positive output terminal of bridge 28 via a bias resistor 27. The output signal which is applied to the gate of thyristor 7 is taken at 30 from the collector of transistor 26.

When the damping of oscillator 6 increases sufficiently to lower the positive bias and thus the conductivity of input transistor 22 to a point where the increase in the resistance of output transistor 26 drives is collector positive enough to fire the thyristor 7, the latter short-circuits the resistor 8*a*. Thyristor 7, quenched after each half-cycle of source 4, fires as long as this condition persists, i.e., until the resumption of high-level oscillations restores (again instantaneously) the previous state of conductivity of stage 26.

According to an important feature of the present invention, the cutoff of transistor 26 opens a resistive shunt across the emitter resistor 14; this shunt includes a negative-feedback resistor 24 and a diode 25 in series with the emitter-collector path of ancillary transistor 26. Prior to such cutoff, as the conductivity in the emitter-collector path of transistor 26 rises with higher oscillation amplitudes, the effective emitter resistance at transistor 10 decreases and the amplification or gain of the oscillator increases.

As long as the metallic part (not shown) controlling the attenuation of the generated oscillations remains beyond the aforedescribed critical distance, the damping is so small that the circuit oscillates at approximately its maximum level. With a high-level oscillator output, corresponding to a nonattenuated or limitedly attenuated oscillation, therefore, the transistor 26 is conductive and the effective emitter resistance of transistor 10 is reduced whereby the amplification factor of the latter is increased. When, conversely, the metallic part approaches to within the critical distance, the increased attenuation triggers the circuit 9, operates the switch 7 and renders transistor 26 nonconductive, thereby raising the emitter resistance 14 to its maximum value and reducing the amplification factor of the oscillator. Hence, the loop gain *KV* is reduced from its normal level and increases the response threshold to provide the desired toggle effect. The hysteresis can be adjusted by means of the variable resistor 24.

It will be apparent that the described system could be readily modified to open, rather than close, an electronic switch such as the thyristor 7 upon the approach of a metallic part to be detected.

I claim:

1. An electronic proximity sensor comprising:

an oscillator responsive to relative movements of an extraneous metallic element for generating oscillations varying in amplitude with the distance of said element therefrom, said oscillator including a main transistor provided with an output circuit;

an ancillary transistor in said output circuit;

biasing means for said ancillary transistor responsive to the amplitude of said oscillations;

an electronic switch connected to said ancillary transistor for reversal thereby upon said amplitude reaching a critical level indicating a predetermined distance of said element from said oscillator;

circuit means connecting said ancillary transistor in a feedback path of said main transistor for varying the gain of said oscillator in a sense tending to maintain said switch in its reversed condition, thereby raising the response threshold of said oscillator to reverse movement of said element and creating a hysteresis effect; and a load connected in circuit with said switch for actuation thereby.

2. A proximity sensor as defined in claim 1 wherein said main transistor has a collector, an emitter and a base, said ancillary transistor forming part of a resistance network connected to said emitter.

3. A proximity sensor as defined in claim 2 wherein said resistance network includes an adjustable resistor for varying said hysteresis effect.

4. A proximity sensor as defined in claim 3 wherein said resistance network further includes a fixed resistor, said ancillary transistor being connected in series with said adjustable resistor across said fixed resistor.

5. A proximity sensor as defined in claim 1 wherein said electronic switch is normally nonconductive and is triggerable into a conductive state upon said amplitude reaching said critical level.

6. A proximity sensor as defined in claim 5 wherein said oscillator is provided with a supply circuit including a two-wire line connected across an alternating-current source, a rectifier bridge in said supply circuit and a coupling network connected across said bridge, said switch being shunted across a portion of said coupling network for short-circuiting same upon being triggered by said ancillary transistor.

7. A proximity sensor as defined in claim 6 wherein said ancillary transistor has a collector lead including a biasing resistance, said switch being a thyristor having an anode-gate circuit connected across said biasing resistance.

8. A proximity sensor as defined in claim 6 wherein said coupling network comprises a high-ohmic resistor and a Zener diode in series therewith, said switch being shunted across said high-ohmic resistor.

9. A proximity sensor as defined in claim 1 wherein said biasing means comprises a transistor stage with a rectifying base circuit and with a resistive/capacitive emitter impedance connected to a base lead of said ancillary transistor.

* * * * *